(12) United States Patent
Kwon et al.

(10) Patent No.: US 7,258,808 B2
(45) Date of Patent: Aug. 21, 2007

(54) HIGH-POWER BALL GRID ARRAY PACKAGE, HEAT SPREADER USED IN THE BGA PACKAGE AND METHOD FOR MANUFACTURING THE SAME

(75) Inventors: Heung-Kyu Kwon, Kyungki-Do (KR); Tae-Je Cho, Kyungki-Do (KR); Min-Ha Kim, Choongcheongnam-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 152 days.

(21) Appl. No.: 10/459,400

(22) Filed: Jun. 10, 2003

(65) Prior Publication Data

US 2004/0012928 A1    Jan. 22, 2004

(30) Foreign Application Priority Data

Jun. 12, 2002   (KR) ........................ 2002-0032972

(51) Int. Cl.
*H01L 21/00* (2006.01)
*H05K 3/02* (2006.01)

(52) U.S. Cl. .................. 216/13; 216/41; 216/49; 216/52; 216/67; 216/100; 216/105; 216/106; 219/121.69; 205/125; 29/847

(58) Field of Classification Search ............ 216/13, 216/14, 17, 41, 49, 105, 106; 219/121.69; 205/123, 125, 152; 438/106, 113, 122; 361/220, 361/713

See application file for complete search history.

(56) References Cited

U.S. PATENT DOCUMENTS 4,458,291 A * 7/1984 Yanagisawa et al. ....... 361/212
5,055,967 A * 10/1991 Sukonnik et al. .......... 361/706
5,909,058 A * 6/1999 Yano et al. ................. 257/712
6,028,489 A * 2/2000 Juang et al. ................. 331/46

(Continued)

FOREIGN PATENT DOCUMENTS

JP         06-021610 A    *   1/1994

(Continued)

OTHER PUBLICATIONS

English language abstract of Korean Publication No. 2001-0008549.

*Primary Examiner*—Anita Alanko
(74) *Attorney, Agent, or Firm*—Marger Johnson & McCollom, P.C.

(57) ABSTRACT

A high-power BGA includes a printed circuit board with a through hole, connection pads formed on the bottom of the printed circuit board, matrix solder balls surrounding the through hole and adjacent to the connection pads, a heat spreader on the top surface of the printed circuit board that includes an insulating layer of a high thermal conductivity, a semiconductor chip mounted within the through hole on the bottom surface of the heat spreader that includes a number of contact pads for bonding with the connection pads using gold wires, and a passive film filling the through hole and around the semiconductor chip. By interposing a ceramic insulating layer between the semiconductor chip and the heat spreader, charge generation between the semiconductor chip and the heat spreader is sharply reduced, and defects such as ESD (electrostatic discharge) is reduced during testing and mounting of the package.

15 Claims, 4 Drawing Sheets

U.S. PATENT DOCUMENTS

| | | | |
|---|---|---|---|
| 6,184,465 B1 * | 2/2001 | Corisis | 174/52.4 |
| 6,197,435 B1 * | 3/2001 | Tsujimura et al. | 428/621 |
| 6,377,461 B1 * | 4/2002 | Ozmat et al. | 361/704 |
| 6,442,043 B1 * | 8/2002 | Seki et al. | 361/761 |
| 6,562,655 B1 * | 5/2003 | Glenn et al. | 438/106 |

FOREIGN PATENT DOCUMENTS

| | | | |
|---|---|---|---|
| JP | 09-199629 A | * | 7/1997 |
| KR | 2001-0008549 | | 2/2001 |

* cited by examiner

HIGH-POWER BALL GRID ARRAY PACKAGE, HEAT SPREADER USED IN THE BGA PACKAGE AND METHOD FOR MANUFACTURING THE SAME

CROSS REFERENCE TO RELATED APPLICATIONS

This application claims priority from Korean Patent Application No. 2002-32972, filed on Jun. 12, 2002, the contents of which are incorporated herein by reference in their entirety.

BACKGROUND OF THE INVENTION

1. Field of the Invention

This disclosure relates to semiconductor packages and, more particularly, to a high-power ball grid array (BGA) package having a heat spreader, a method for manufacturing the heat spreader, a BGA printed circuit board (PCB) to which the method is applied, and a method for manufacturing the BGA PCB.

2. Description of the Related Art

As devices become highly integrated, the number of connection pads in a semiconductor device, such as a semiconductor memory device, increases. Thus, the number of lead lines in a package included in a PCB also increases. As the number of lead lines increases, a lead frame using conventional package technology cannot be applied to a highly-integrated semiconductor chip having over 400 lead lines. Accordingly, a BGA package has been introduced in which package output terminals are arranged on a large bottom board of the package.

The BGA package includes a square-shaped main body, a semiconductor chip which is mounted on the top surface of the main body, and matrix solder balls at the bottom surface of the main body that contact the printed circuit board and thus can be arranged and mounted on a pad of the printed circuit board by using a reflow process.

Such a BGA package requires a heat spreader on the surface of the semiconductor chip so as to emit heat to the outside the package when a considerable amount of heat is generated during the operation of the semiconductor chip. However, since a gold wire is formed upwardly to connect the semiconductor chip with the pad of the main body of the package, it is difficult to mount the heat spreader on the BGA package and so such BGA package is not appropriate for a high-power BGA package.

Referring to FIG. 12, illustrated is a conventional, high-power BGA package structured to overcome the heat emitting problem of the conventional BGA package described above. The conventional high-power BGA package includes a package printed circuit board 1200, a through portion 1200a at the center of the package circuit board 1200, pads for bonding (not shown) at the bottom surface of the printed circuit board 1200, a heat spreader 1110 that is connected to the top surface of a metal layer 1120, a supporting main body 1130 that is connected to the bottom surface of the heat spreader 1110, and a semiconductor chip 1101 that is mounted under the supporting main body 1130 within the through portion 1200a, includes a plurality of metal pads 1101a on its bottom surface, and is connected to pads for the bonding (not shown) and gold wires 1101b. This conventional high-power BGA package is capable of easily emitting heat away and cooling the semiconductor chip through the heat spreader 1110 that is stably mounted on the surface of the BGA package, even though the heat is generated in the semiconductor device.

The heat spreader 1110 of the conventional high-power BGA package, however, is composed of conductive copper and surface-processed nickel, a fact that results in a constant voltage between the semiconductor chip 1101 and the heat spreader 1110 during the operation of the semiconductor chip 1101 and can cause damage to the semiconductor chip 1101 in many cases. Consequently, the semiconductor device yield of the conventional BGA package decreases, and the reliability of the semiconductor device may not be ensured when mounting the semiconductor chip on the printed circuit board.

Embodiments of the invention address these and other limitations of conventional devices.

SUMMARY OF THE INVENTION

Embodiments of the invention include a high-power BGA package, a heat spreader used for the high-power BGA package, and a method for manufacturing the high-power BGA package and the heat spreader.

BRIEF DESCRIPTION OF THE DRAWINGS

The stated features and advantages of embodiments of the invention will become more apparent by describing in detail preferred embodiments thereof with reference to the following attached drawings.

DETAILED DESCRIPTION OF THE INVENTION

Figure 1:
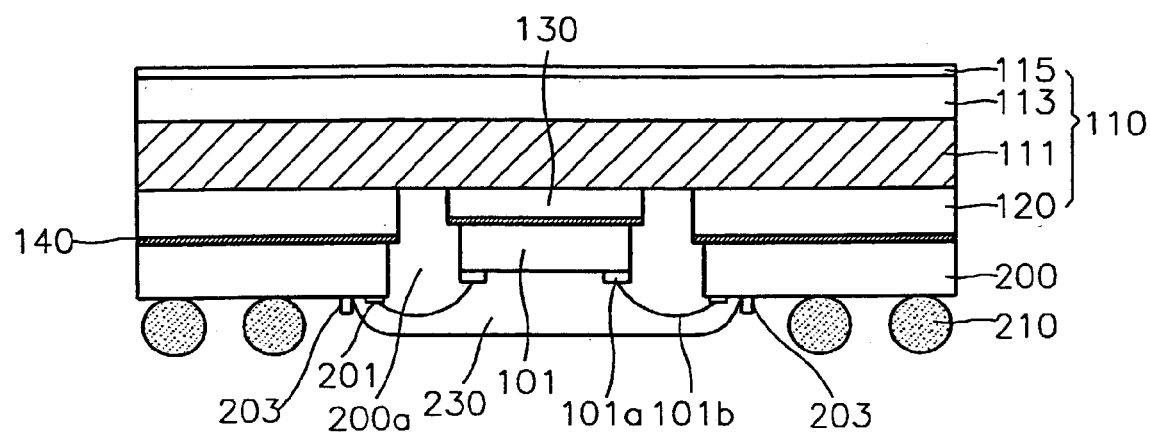
FIG. 1 is a cross sectional view of a high-power BGA package according to an embodiment of the invention.

Embodiments of the invention now will be described more fully with reference to the accompanying drawings, in which preferred embodiments of the invention are shown. In the drawings, the shapes of elements are exaggerated for clarity, and like reference numerals are used to refer to like elements throughout.

FIG. 1 is a cross sectional view of a high-power BGA package according to an embodiment of the invention.

Referring to FIG. 1, a high-power BGA package includes a printed circuit board 200 having a square shape and in which a metal interconnection (not shown) is embedded and a through portion 200a is formed at the center. The printed circuit board 200 includes a plurality of connection pads 201 surrounding the through portion 200a, a heat spreader 110 that is attached to a lower metal layer 120 on the surface of the printed circuit board 200 and includes an insulating layer 111 formed of a ceramic material, a semiconductor chip 101 in which there are a plurality of metal pads 101a near the center of the bottom surface of the heat spreader 110, the metal pads 101*a* being mounted outwardly through the through hole 120*a* (FIG. 2) and connected with the connection pad 201 by gold wires bib, a passive film 230 that fills the through portion 200*a* and forms a protection layer outside of the passive film 230, and a dam 203 which surrounds the outside of the passive film 230 and protrudes from the printed circuit board 200.

The printed circuit board 200 is a generally square board whose shape is suitable for the BGA package. In the center of the printed circuit board 200 the through portion 200*a*, which is square in shape, is formed within the printed circuit board 200 so the semiconductor chip 101 can be mounted therein. Around the through portion 200*a*, the connection pads 201 the metal interconnection (not shown) embedded in the printed circuit board 200 and electrically connect the metal interconnection with the semiconductor chip 101.

In the region adjacent to the connection pads 201 on the bottom surface of the printed circuit board 200, solder balls 210 are formed surrounding the through portion 200*a*. The solder balls 210 are formed of a low melting point eutectic metal alloy, such as a lead (Pb) or tin (Sn) alloy. When the BGA package is mounted on a mounted body (not shown), a reflow process is performed by applying heat, and the solder balls 210 are melted and alloyed with an adhesive pad (not shown) of the mounted body, thereby allowing the printed circuit board 200 to easily adhere to the mounted body.

Figure 2:
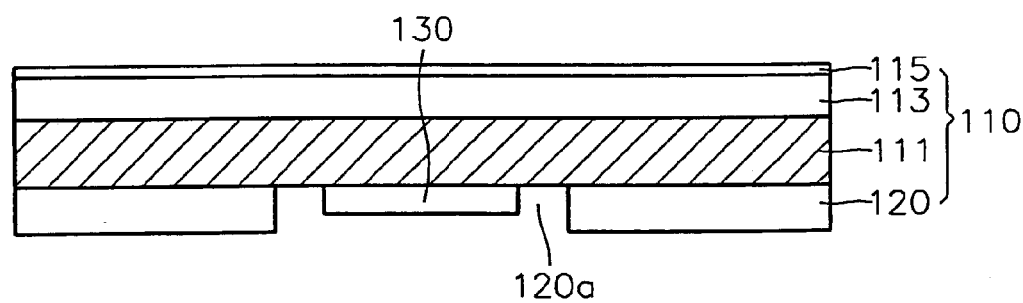
FIG. 2 is a cross sectional view of a heat spreader that is mounted on the high-power BGA package of FIG. 1.

FIG. 2 is a cross sectional view of a heat spreader that is mounted on the high-power BGA package of FIG. 1

Referring to FIG. 2, on the surface of the printed circuit board 200, the heat spreader 110 of the high-power BGA package is a generally square board of roughly the same size and shape as the printed circuit board 200 and is formed to contact the upper portion of the through portion 200*a* (FIG. 1). That is, formed on the region on which the printed circuit board 200 contacts are a lower metal layer 120 having a through portion 120*a* shaped like the through portion 200*a* of the printed circuit board 200, an insulating layer 111 on the lower metal layer 120, an upper metal layer 113 on the insulating layer 111, and a protection layer 115 on the upper metal layer 113 to protect the surface of the upper metal layer 113.

The insulating layer 111 can be formed of a ceramic of a high thermal conductivity, such as AlN, Al$_2$O$_3$, BeO, or the like. Then, the ceramic functions as an insulating material and as a thermal conductor, thereby heat emission can be obtained. The upper metal layer 113 on the insulating layer 111 and the lower metal layer 120 under the insulating layer 111 are grounding electrodes and are formed of copper (Cu), a copper alloy, or the like. Forming a material having a high thermal conductivity, i.e., the upper metal film 113, on the upper portion of the insulating layer 111 enhances the heat emission. In addition, on the surface of the upper metal layer 113, the protection layer 115 may be further formed of nickel Ni, a nickel alloy, or the like, having a good etching quality so as to protect the surface of the metal layer 113. Consequently, in the heat spreader 110, the lower metal layer 120 contacts the printed circuit board 200 and the insulating layer 111, and the upper metal layer 113 and the protection layer 115 are sequentially formed on the lower metal layer 120.

FIGS. 3 through 7 are sectional views illustrating a sequence of steps in the manufacturing of the heat spreader for the high-power BGA package according to embodiments the present invention.

Figure 3:
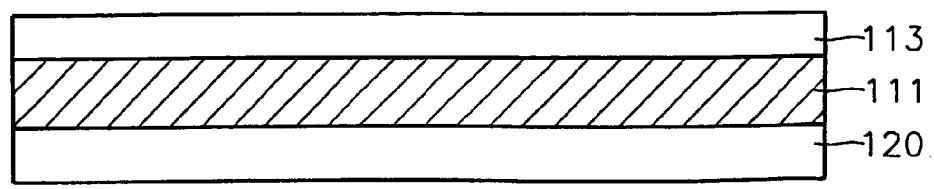
FIGS. 3 through 7 are cross sectional views illustrating a sequence of steps in the manufacturing of the heat spreader for the high-power BGA package according to embodiments of the invention.

Referring to FIG. 3, an insulating board 111 having a predetermined size and shape is prepared. (The insulating board will become the insulating layer of the heat spreader, and thus the same reference numeral (111) is used for the insulating board). The insulating board 111 is preferably shaped like a square board so that a maximum number of the heat spreaders 110 can be manufactured from a given insulating board 111. The insulating board 111 is made of a ceramic having a high thermal conductivity, such as AlN, Al$_2$O$_3$, or BeO, for instance. Thin metal layers are applied to both sides of the prepared insulating board 111 and the lower metal layer 120 and the upper metal layer 113 are arranged on the insulating board 111. Here, the upper and lower metal layers 113 and 120 have high electric and thermal conductivities and are formed of material such as copper (Cu) or a copper alloy. The upper and lower metal layers 113 and 120 are formed on both sides of the insulating board 111 by adhering the prepared thin metal layers to both sides of the insulating board 111 through direct adherence or brazing. Such adherence is advantageous for low cost production. Alternatively, the upper and lower metal layers 113 and 120 may be formed by electroless plating or physical vapor deposition, or by other methods.

Figure 4:
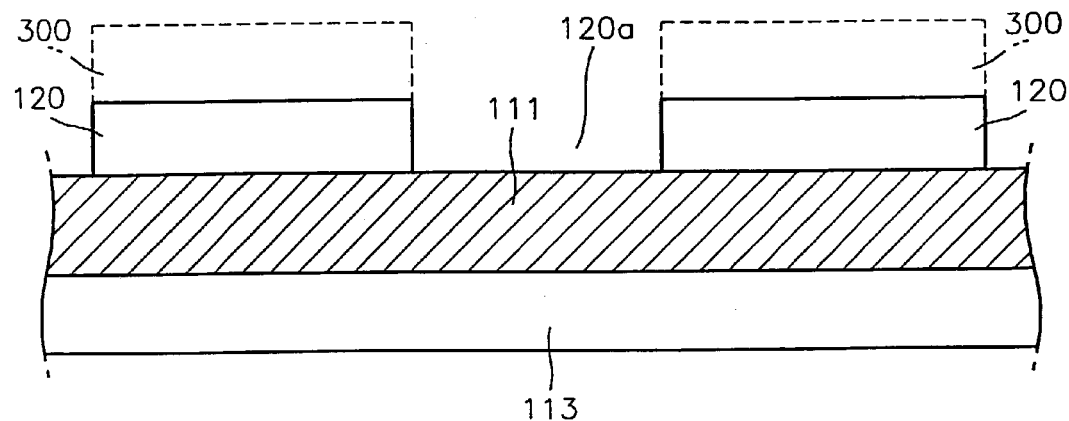

Referring to FIG. 4, a chip receiving portion 120*a*, where the semiconductor chip 101 will be mounted after a patterning process, is formed on the lower metal layer 120. One method for forming the chip receiving portion is for a photoresist 300 to be formed on the lower metal layer 120, and a pattern for the chip receiving portion 120*a* to be formed on the photoresist 300. The exposed metal layer 120 is then removed by wet etching with sulfuric acid and hydrochloric acid using the photoresist 300 as a mask. Alternatively, the exposed metal layer may be etched using a dry etch process such as reactive ion etching (RIE) or plasma etching in order to form finer patterns. A pattern of the chip receiving portion 120*a* is printed on the lower metal layer 120.

Figure 5:
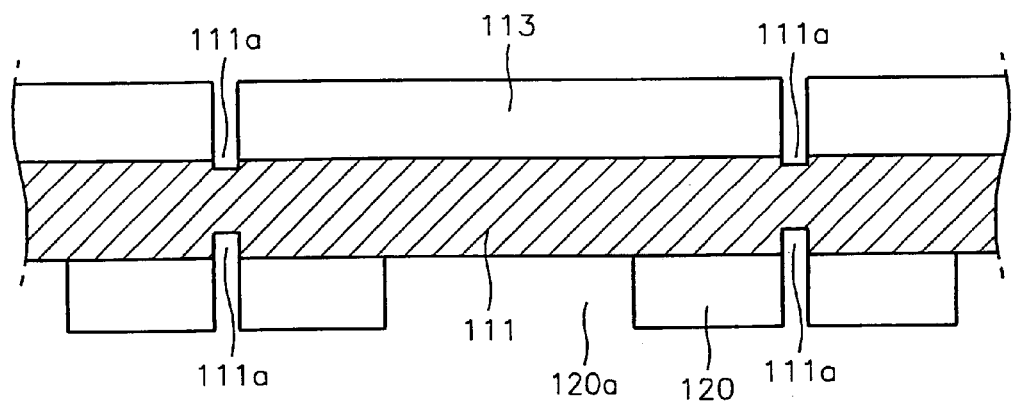

Referring to FIG. 5, a cutting pattern 111*a* is formed on the upper metal layer 113 and the lower metal layer 120 so that the heat spreader 110 can be cut to a predetermined size. Here, the cutting pattern may be formed by a laser. The upper and lower metal layers 113 and 120 are completely cut, and the cutting pattern 111*a* partially cuts through the surface of the insulating board 111 to a predetermined depth. Consequently, the heat spreader 110 can be easily cut to a predetermined size using the cutting pattern 111*a* on the insulating board 111.

Figure 6:
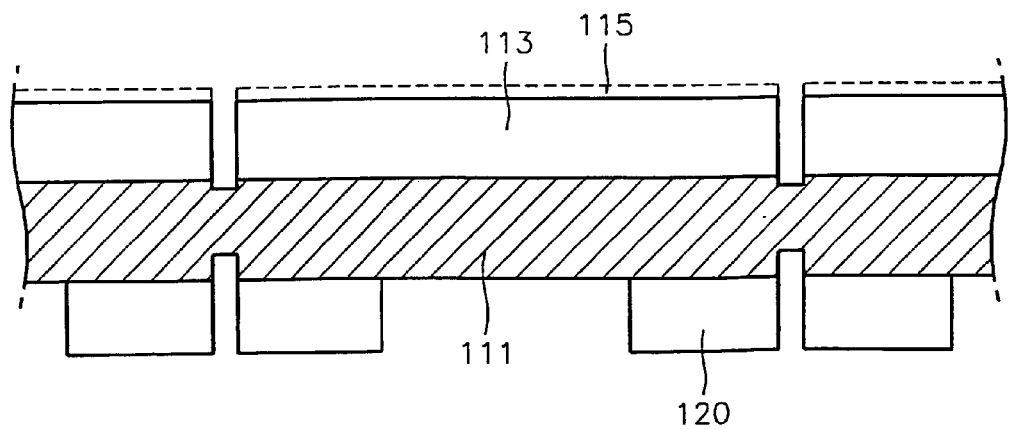

Referring to FIG. 6, a protection layer 115 is formed on the surface of the upper metal layer 113. Here, the protection layer 115 can be made of nickel Ni or a nickel alloy and may be formed by electroless plating, sputtering, or physical vapor deposition such as metal evaporation. The protection layer 115 protects the surface of the metal layer 113 by preventing the surface of the upper metal layer 113 from being exposed to an etching environment.

Figure 7:
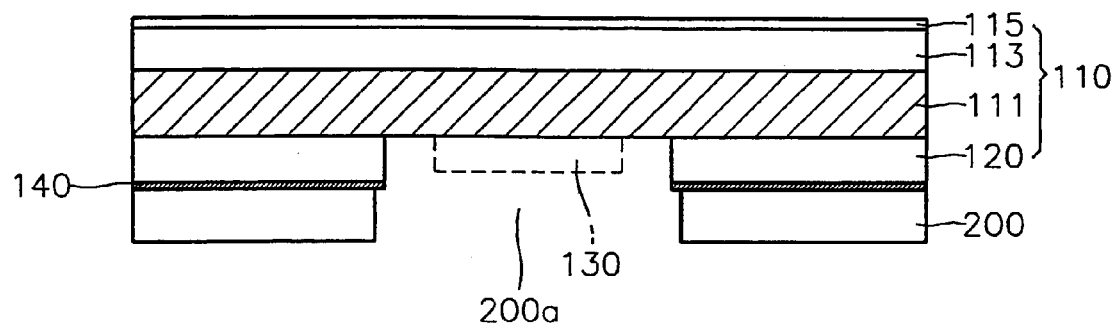
Figure 8:
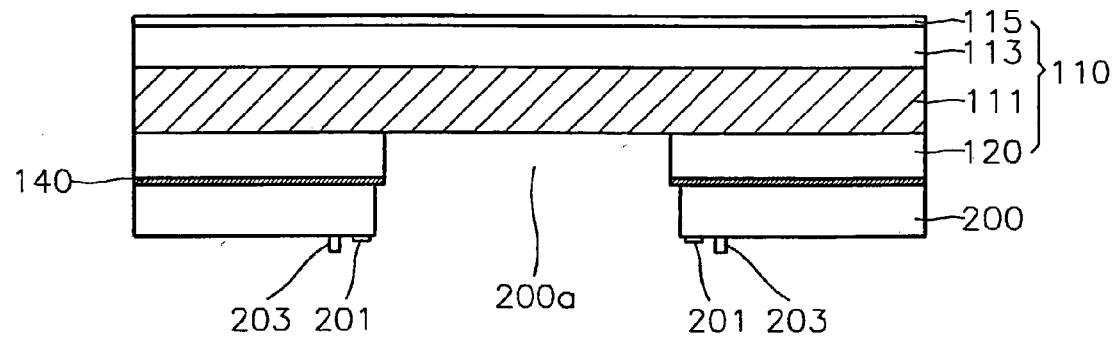
FIGS. 8 through 11 are cross sectional views illustrating example processes that can be used in the manufacturing of the high-power BGA package according to embodiments of the invention.

Referring to FIG. 7, after the manufacturing is completed, an individual heat spreader 110 is produced by cutting the heat spreader 110 to a predetermined size using the cutting method described above. When mass production of the BGA package process is required, a single heat spreader 110 or a grouping of of heat spreaders may be cut, e.g., a unit composed of 8 heat spreaders.

FIGS. 8 through 11 are sectional views illustrating a sequence of steps in the manufacturing of the high-power BGA package having the heat spreader described in FIGS. 3 to 7.

Referring to FIGS. 8 through 11, the printed circuit board 200 for the high-power BGA package, which is manufactured according to conventional methods, is mated with the heat spreader 110. At the center of the printed circuit board 200, a through portion 200a having a square shape and a predetermined size is formed. At the surface of the printed circuit board 200, connection pads 201 are formed surrounding the through portion 200a. The other surface of the printed circuit board 200 has a flat junction side to contact the heat spreader 110. The flat junction side is mated to the lower metal layer 120 of the heat spreader 110. Here, it is desirable that a junction layer, such as a black oxide layer 140, is further included between the printed circuit board 200 and the lower metal layer 120. The black oxide layer 140 is applied to the metal of the heat spreader 110 to improve the junction between a pre-pleg, which is a material for the junction of the printed circuit board 200 and the surface of the heat spreader 110, which is formed of a contact metal such as copper or nickel.

A dam 203 protrudes from the bottom of the printed circuit board 200. The dam 203 functions as a sidewall that prevents the liquid filler material of the passive film 230 (see FIGS. 1 and 11) from flowing over the dam 203 when the passive film 230 is subsequently formed.

Figure 9:
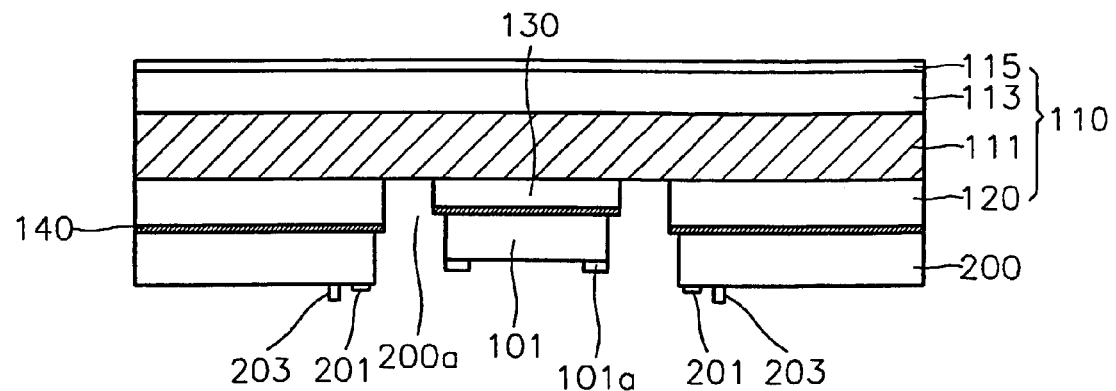

Referring to FIG. 9, a chip supporting body 130 is formed on the bottom surface of the insulating layer 111 of the heat spreader 110, which is exposed by a through portion 200a of the printed circuit board 200, and the semiconductor chip 101 is adhered to the chip supporting body 130. Here, the semiconductor chip 101 is mounted such that the side where the metal pads 101a are formed faces downward.

Figure 10:
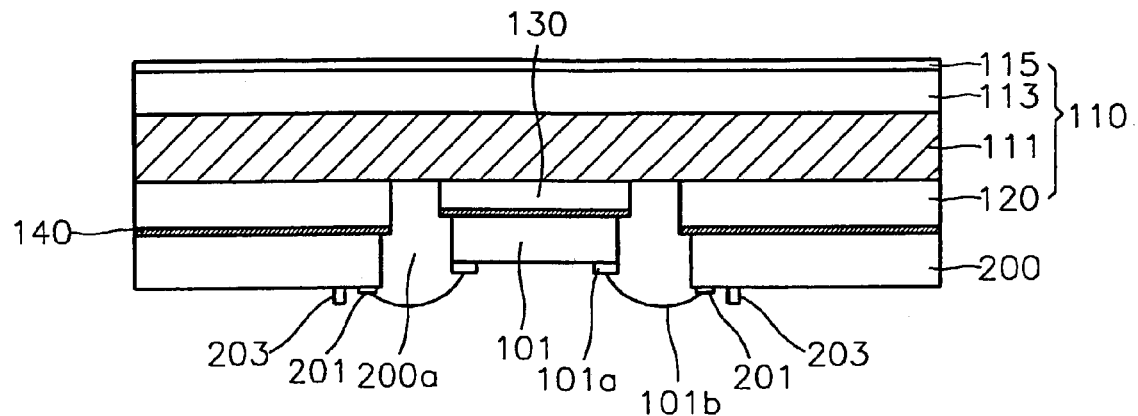
Figure 11:
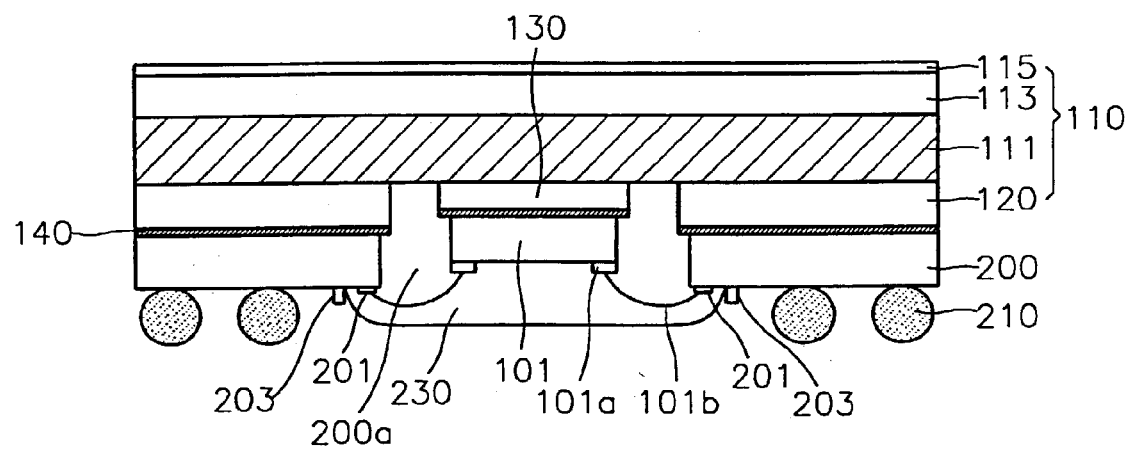
Figure 12:
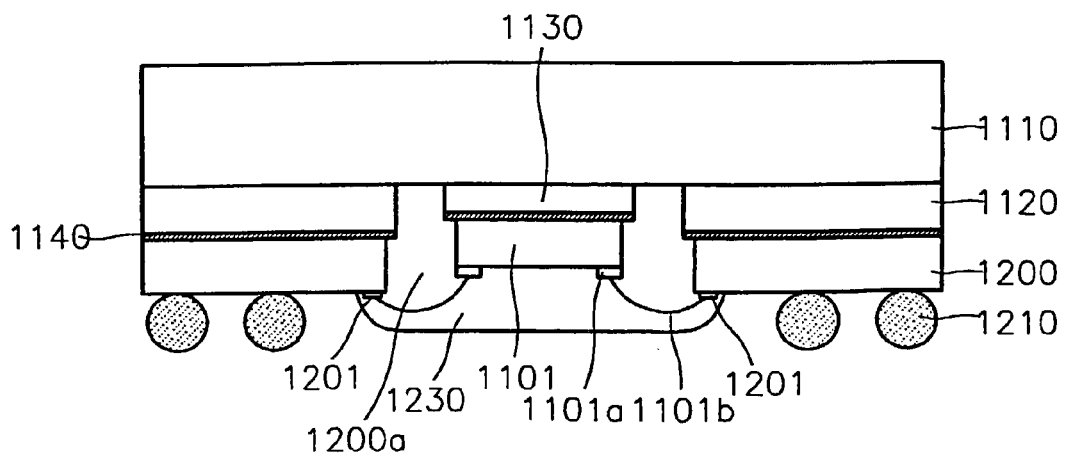
FIG. 12 is a cross sectional view of a conventional high-power BGA package.

Referring to FIG. 10, metal pads 101a on the semiconductor chip 101 are connected to the connection pads 201 on the printed circuit board 200 with gold wires 101b (FIG. 11). The metal pads 101a and the connection pads 201a face downward, and so the gold wires 101b are connected such that the surface of the insulating layer 111 of the heat spreader 110 exposed through the through portion 200a faces downward.

Referring to FIG. 11, a passive film 230 is formed of a synthetic resin to fill the through portion 200a where the semiconductor chip 101 is located and to completely cover the region where the connection pads 201 on the printed circuit board 200 are formed. The passive film 230 protrudes in the area between the dam 203 at the bottom of the printed circuit board 200.

A number of solder balls 201 are formed surrounding the through portion 200a where the printed circuit board 200 is exposed. Here, it is preferable to form the solder balls 201 in the shape of a matrix to achieve a high solder ball density. The dam 203 can either be formed when the printed circuit board 200 is manufactured or when the package assembly is manufactured.

As described above, according to the high-power BGA package of embodiments of the invention, the heat spreader 110 that includes the insulating layer 111 between the heat spreader 110 and the printed circuit board 200 includes a ceramic of a high conductivity to prevent static electricity from charges flowing between the semiconductor chip 101 and the upper metal layer 113, which functions as ground for the heat spreader 110. By using a ceramic of a high thermal conductivity, it is possible to not only obtain the same heat emission effect as the heat emission of the metal layer but also enhance the mechanical strength as a result of the characteristics of the ceramic.

In manufacturing the heat spreader 110, the heat spreader 110 is easily cut to a predetermined size, and any mistakes made during the cutting of the heat spreader 110 can be reduced by forming grooves to a predetermined depth on the insulating board 111 of the heat spreader 110 according to the cutting pattern 11a, as described above.

The dam 203 may be formed when the printed circuit board 200 is manufactured or when the package is assembled.

The high-power BGA package and a method for manufacturing the heat spreader of the high-power BGA package according to embodiments of the invention are advantageous for the following reasons.

In the high-power BGA package the capacitance occurring between the semiconductor chip and the heat spreader is reduced. Consequently, the number of defects such as ESD (electrostatic discharge) is sharply reduced.

Furthermore, through the method for manufacturing the heat spreader of the high-power BGA package, a cutting pattern of grooves cut through the metal layers and partially through the insulating board is formed such that the heat spreader can be easily cut, and any mistakes made during the cutting of the heat spreader can be reduced.

According to specific examples of the present invention, there is provided a high power ball grid array including a printed circuit board which has a through hole near its center, connection pads which are formed on the bottom of the printed circuit board, matrix solder balls which surround the through hole and are adjacent to the connection pads on the bottom of the printed circuit board, a heat spreader which is formed on the top surface of the printed circuit board and includes an insulating layer of a high thermal conductivity, a semiconductor chip which is mounted downwardly on the bottom surface of the heat spreader, within the through hole, and includes a plurality of pads for bonding via gold wires with the connection pad, and a passive film which fills the through hole and is formed at the bottom of the semiconductor chip.

The printed circuit board can be formed of a synthetic resin or a ceramic material, for instance. The heat spreader includes a chip supporting body to which the semiconductor chip can be adhered to, the ceramic film which is formed on the surface of the chip supporting body, a metal layer which is formed on the surface of the ceramic film, and a protection layer which is formed on the surface of the metal layer to protect the metal layer. Here, the ceramic can include, for example, AIN, BeO, and $Al_2O_3$. The metal layer can include copper or a copper alloy. The protection layer is typically nickel or nickel alloy formed by electroless plating, or could be another material formed in another way.

In addition, in a region adjacent to the through hole, the printed circuit board further includes a dam which surrounds the passive film and projects from the printed circuit board.

Another specific example includes a heat spreader for a high-power ball grid array, the heat spreader having a board for emitting heat which is formed by sequentially depositing a supporting main body having a board shape and made of a ceramic, a metal layer for emitting heat, and a protection layer on the surface of the supporting main body, a lower metal layer which is formed on the bottom surface of the supporting main body and has a region where the chip can be mounted, and a region which is formed at the center of the heat spreader and where the semiconductor chip can be adhered.

The supporting main body could be AIN, BeO, and $Al_2O_3$, for instance. The metal layer for emitting heat and the lower metal layer could be formed of copper or a copper alloy. The protection layer can be nickel or nickel alloy, the layer formed by electroless plating.

Also disclosed are specific embodiments for manufacturing a heat spreader for a high-power ball grid array. The method includes preparing an insulating board, forming a metal layer on both surfaces of the insulating board formed of a ceramic, patterning the metal layer on one surface of the insulating board formed of a ceramic, to form a region to which the semiconductor chip can be adhered, cutting the metal layer on both surfaces of the insulating board formed of a ceramic to a predetermined size and recessing the surface of the insulating board of a ceramic to a predetermined depth, and forming a protection layer on the surface of the metal layer on both surfaces of the insulating board formed of a ceramic.

Here, the insulating board is formed of a ceramic.

The metal layer can have the same size as the insulating layer, and can be adhered to the metal layer onto both surfaces of the insulating layer. The metal layer could be copper or copper alloy. Adhering the metal layer to the insulating layer can be performed by direct copper bonding or metal brazing, for instance.

Patterning the metal layer can include forming a photoresist on the metal layer on one surface of the insulating layer, forming a pattern of a chip receiving portion where the semiconductor chip can be mounted, by applying a photo process to the photoresist, and transferring the pattern of the chip receiving portion on the metal layer by removing the metal layer which is exposed by etching using the patterned photoresist as a mask. The etching can be wet etching using an acid solution, for example.

A laser can be used for the cutting.

The protection layer can be nickel or nickel alloy, for instance. The protection layer is formed by electroless plating.

Patterning the metal layer can also include forming an oxide layer for a junction on the surface of the metal layer where the printed circuit board is mounted. The oxide layer for the junction can be a black oxide layer.

According to the high-power BGA package of some embodiments of the present invention, a ceramic layer of low conductivity, which is electrically insulated from a metal layer, is interposed between the semiconductor chip and the heat spreader, and thus the heat spreader on the surface of the semiconductor chip can reduce generation of charges between the semiconductor chip and the heat spreader. Accordingly, defects such as electrostatic discharge (ESD) can be reduced when applying an external voltage to high-power BGA package.

While this invention has been particularly shown and described with reference to preferred embodiments thereof, it will be understood by those skilled in the art that various changes in form and details may be made therein without departing from the spirit and scope of the invention as defined by the appended claims and equivalents.

The invention claimed is:

1. A method for manufacturing a heat spreader for use in a ball grid array package, the method comprising:
   providing an insulating board having a thermal conductivity that is at least as high as that of a material selected from the group consisting of AlN, BeO, and $Al_2O_3$;
   forming an upper ground metal layer having a thermal conductivity that is at least as high as that of a material selected from the group consisting of copper and copper alloy and a lower metal layer on an upper and lower surface, respectively, of the insulating board, the insulating board and upper metal layer together conducting heat from a semiconductor chip when it is operated in the ball grid array package;
   forming a region configured to attach to a semiconductor chip by removing only a central portion of the lower metal layer of a size sufficient to receive a semiconductor chip while leaving the remainder of the layer surrounding the central portion;
   cutting a first groove through the upper metal layer to a first predetermined depth of the insulating board;
   cutting a second groove through the lower metal layer to a second predetermined depth of the insulating board, wherein the first and second grooves are substantially aligned;
   forming a protection layer on the upper metal layer; and
   cutting out the heat spreader defined by the first and second grooves.

2. The method of claim 1, wherein the insulating board is ceramic.

3. The method of claim 1, wherein forming a upper and a lower metal layer further comprises:
   preparing the upper and lower metal layers to have the same size as the insulating board; and
   adhering the upper and lower metal layers to the corresponding first and second surfaces of the insulating board.

4. The method of claim 3, wherein the upper and lower metal layers comprise a material chosen from the group consisting of copper and copper alloy.

5. The method of claim 3, wherein adhering the upper and lower metal layers to the corresponding upper and lower surfaces of the insulating layer comprises performing a process selected from the group consisting of direct copper bonding and metal brazing.

6. The method of claim 1, wherein forming a upper and a lower metal layer further comprises:
   forming a photoresist on the upper metal layer;
   forming a mask pattern of the region by applying a photo process to the photoresist; and
   transferring the mask pattern onto the upper metal layer by etching the upper metal layer exposed by the mask pattern.

7. The method of claim 6, wherein the etching is wet etching using an acid solution.

8. The method of claim 1, wherein the cutting is performed using a laser.

9. The method of claim 1, wherein forming the protection layer comprises forming a protection layer of a material chosen from the group consisting of nickel and a nickel alloy.

10. The method of claim 9, wherein the protection layer is formed by electrolysis plating.

11. The method of claim 1, wherein the method further comprises forming an oxide layer for a junction on the surface of the lower metal layer for attaching a printed circuit board.

12. The method of claim 11, wherein the oxide layer is a black oxide layer.

13. The method of claim 1, further comprising:
   cutting the insulation board by cutting through select first and second groves.

14. The method of claim 1 wherein said lower metal layer comprises a ground metal layer.

15. The method of claim 1 further comprising mounting a chip supporting body on the lower surface of the insulating board in the region configured to attach the semiconductor chip, the chip being mounted on the chip supporting body when the heat spreader is in an operative condition.

* * * * *

UNITED STATES PATENT AND TRADEMARK OFFICE
CERTIFICATE OF CORRECTION

| | |
|---|---|
| PATENT NO. | : 7,258,808 B2 |
| APPLICATION NO. | : 10/459400 |
| DATED | : August 21, 2007 |
| INVENTOR(S) | : Heung-Kyu Kwon et al. |

Page 1 of 1

It is certified that error appears in the above-identified patent and that said Letters Patent is hereby corrected as shown below:

Column 3, line 3, the word "bib" should read -- 101b --;
Column 3, line 14, the words "201 the" should read -- 201 draw the --;
Column 6, line 2, the word "11a" should read -- 111a --.

Signed and Sealed this

Second Day of September, 2008

JON W. DUDAS
*Director of the United States Patent and Trademark Office*